(12) United States Patent
Weberg et al.

(10) Patent No.: US 10,230,382 B2
(45) Date of Patent: Mar. 12, 2019

(54) OSCILLATOR CALIBRATION

(71) Applicant: Nordic Semiconductor ASA, Trondheim (NO)

(72) Inventors: Stein Erik Weberg, Trondheim (NO); Ingil Sundsbø, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 15/537,014

(22) PCT Filed: Dec. 14, 2015

(86) PCT No.: PCT/GB2015/053972
§ 371 (c)(1),
(2) Date: Jun. 16, 2017

(87) PCT Pub. No.: WO2016/097707
PCT Pub. Date: Jun. 23, 2016

(65) Prior Publication Data
US 2017/0346496 A1    Nov. 30, 2017

(30) Foreign Application Priority Data

Dec. 16, 2014   (GB) .................................. 1422351.5

(51) Int. Cl.
*H03L 7/06*   (2006.01)
*H03L 7/197*  (2006.01)
(Continued)

(52) U.S. Cl.
CPC .............. *H03L 7/197* (2013.01); *H03L 7/085* (2013.01); *H03L 7/0992* (2013.01);
(Continued)

(58) Field of Classification Search
CPC ....... H03L 7/197; H03L 7/085; H03L 7/0992; H03M 3/30; H04B 1/40
(Continued)

(56) References Cited

U.S. PATENT DOCUMENTS

| 6,903,613 B1* | 6/2005 | Mitchell | ................. H03L 7/099 331/11 |
| 7,590,387 B2* | 9/2009 | Chien | ..................... H03L 7/099 375/358 |

(Continued)

FOREIGN PATENT DOCUMENTS

| GB | 2498946 A | 8/2013 |
| WO | WO 2007/055870 A2 | 5/2007 |

OTHER PUBLICATIONS

International Search Report and Written Opinion for PCT/GB2015/053972, dated Feb. 4, 2016, 11 pages.
(Continued)

*Primary Examiner* — Ryan Jager
(74) *Attorney, Agent, or Firm* — Klarquist Sparkman, LLP

(57) ABSTRACT

A phase locked loop comprises:
  a controllable oscillator 102;
  a variable divider arrangement 108, 110 which takes a signal from the controllable oscillator 102 and divides it by a variable amount to provide a lower frequency signal;
  a sigma-delta modulator 112 arranged to provide a control input to said variable divider arrangement 108, 110; and
  a phase detector triggered 104 by said lower frequency signal and a reference clock;
wherein said phase locked loop is arranged to be operable in a normal mode in which the controllable oscillator 102 is controlled by a voltage from said phase detector 104 and a
(Continued)

calibration mode in which the controllable oscillator 102 is controlled digitally by a signal from a calibration module 114 which receives an input from said variable divider arrangement 108, 110.

13 Claims, 1 Drawing Sheet

(51) Int. Cl.
*H03L 7/085* (2006.01)
*H03L 7/099* (2006.01)
*H03M 3/00* (2006.01)
*H04B 1/40* (2015.01)

(52) U.S. Cl.
CPC ............ *H03L 7/1976* (2013.01); *H03M 3/30* (2013.01); *H04B 1/40* (2013.01)

(58) Field of Classification Search
USPC ........................................................ 327/117
See application file for complete search history.

(56) References Cited

U.S. PATENT DOCUMENTS

| | | |
|---|---|---|
| 9,762,220 B2 * | 9/2017 | Han ................. H03K 5/131 |
| 2002/0036545 A1 | 3/2002 | Fridi et al. |
| 2004/0085103 A1 * | 5/2004 | Ahn .................. H03L 7/1978 327/156 |
| 2009/0079605 A1 | 3/2009 | Chang |
| 2009/0122937 A1 * | 5/2009 | Maskou ............. H03L 7/081 375/362 |
| 2012/0098603 A1 * | 4/2012 | Cho .................. H03L 7/099 331/34 |
| 2013/0069696 A1 | 3/2013 | Koerner |
| 2013/0278303 A1 * | 10/2013 | Chen ................. H03L 7/101 327/117 |
| 2016/0164558 A1 * | 6/2016 | Elzeftawi ........... H03B 19/12 455/192.1 |

OTHER PUBLICATIONS

Search Report under Section 17(5) for GB1422351.5, dated Mar. 25, 2015, 4 pages.

* cited by examiner

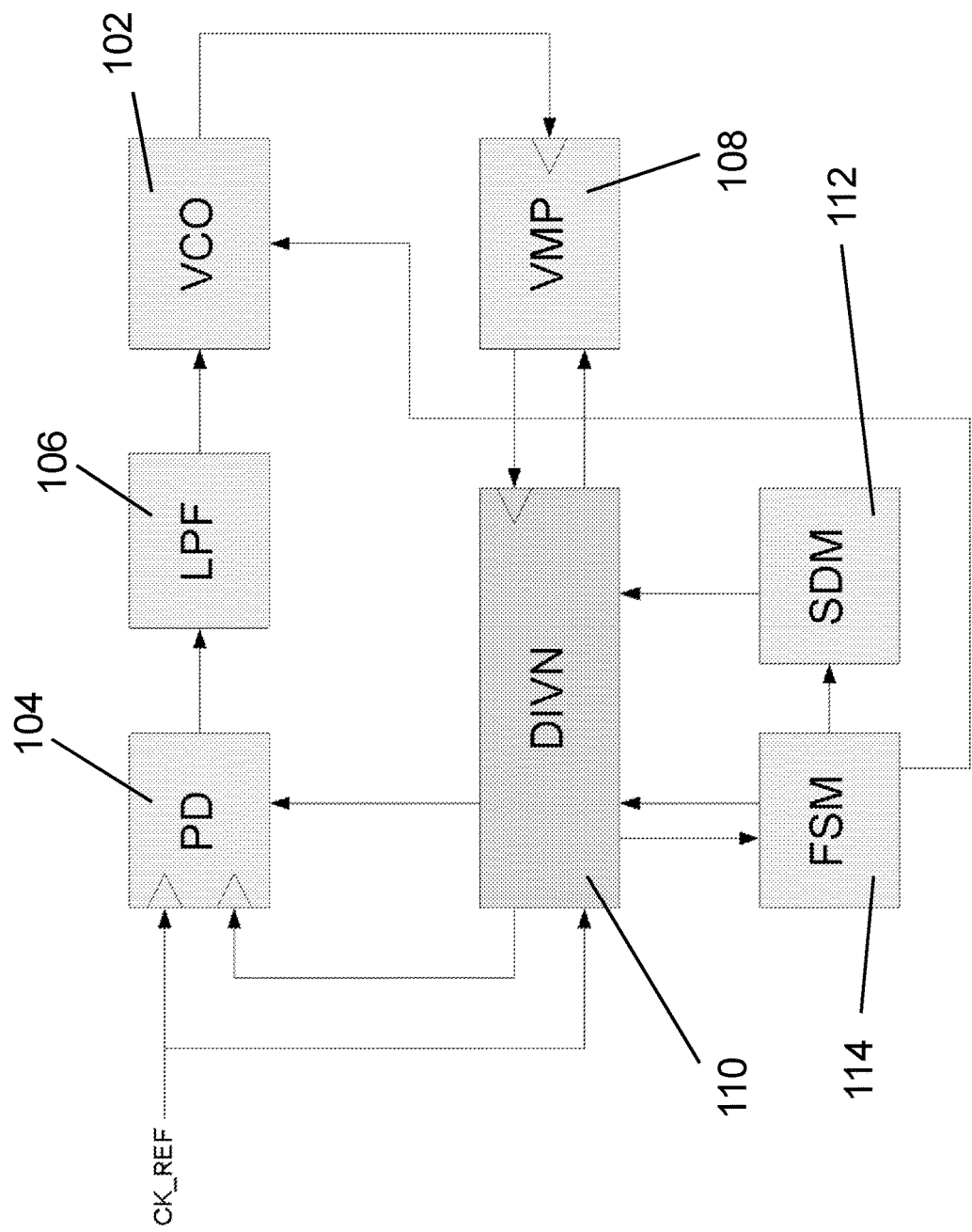

OSCILLATOR CALIBRATION

CROSS REFERENCE TO RELATED APPLICATIONS

This is the U.S. National Stage of International Application No. PCT/GB2015/053972, filed Dec. 14, 2015, which was published in English under PCT Article 21(2), which in turn claims the benefit of Great Britain Application No. 1422351.5, filed Dec. 16, 2014. The Great Britain application is incorporated herein by reference in its entirety.

This invention relates to the calibration of oscillators, particularly although not exclusively tuning the voltage controlled oscillator of a phase-locked loop used in a frequency synthesizer. e.g. for tuning applications in digital radio transmitters and receivers.

Voltage controlled oscillators (VCOs) are commonly used in phase locked loops (PLLs). A problem with VCOs which has been appreciated by the Applicant is that when they are used in PLLs which form part of frequency synthesizers for digital radio applications, they are required to operate over a relatively large frequency range—e.g. of the order of hundreds of MHz This frequency tuning range may need to be accommodated within a voltage swing of only 0.6V which means the VCO needs to have a very high gain and thus be sensitive to loop filter noise.

Such a sensitivity in turn requires a large filter which implies a need for a large capacitance which is costly in terms of integrated circuit area. Typical VCOs also exhibit lots of variation: for example their capacitance may vary by as much as 15% which leads to a change in the centre frequency.

The present invention aims to provide a different approach.

When viewed from a first aspect the invention provides a phase locked loop comprising:
- a controllable oscillator;
- a variable divider arrangement which takes a signal from the controllable oscillator and divides it by a variable amount to provide a lower frequency signal;
- a sigma-delta modulator arranged to provide a control input to said variable divider arrangement; and
- a phase detector triggered by said lower frequency signal and a reference clock;

wherein said phase locked loop is arranged to be operable in a normal mode in which the controllable oscillator is controlled by a voltage from said phase detector and a calibration mode in which the controllable oscillator is controlled digitally by a signal from a calibration module which receives an input from said variable divider arrangement.

Thus it will be seen by those skilled in the art that in accordance with the invention the controllable oscillator can be controlled digitally by the calibration module in the calibration mode. This allows for a coarse tuning to be effected so that voltage control of the output frequency only needs to be used for fine tuning within a small subset of the overall frequency range. This in turn means that the sensitivity of the controllable oscillator can be significantly reduced which reduces the problem of noise.

Having the sigma-delta modulator operating during the calibration mode ensures that adequate resolution is available in the control which can be asserted over the controllable oscillator but in a set of embodiments the sigma-delta modulator is arranged to operate in a different mode during said calibration mode than during said normal mode. In an exemplary set of such embodiments the sigma-delta modulator is arranged to operate with second order multi-stage noise shaping (MASH), e.g. MASH 1-1 in said calibration mode and with third order multi-stage noise shaping, e.g. MASH 1-1-1 in said normal mode. This reflects the Applicant's appreciation that although third order shaping gives low in-band noise, it gives very high out-of-band quantisation noise which would significantly interfere with calibration.

The calibration module could be arranged to determine whether the controllable oscillator is running too fast or too slow at a given point during calibrations and thus whether a digital calibration signal output from the calibration module is required to increase or decrease the frequency of the controllable oscillator. However the Applicant has appreciated that such an arrangement would require a data bus extending between the divider arrangement and the calibration module which would therefore need to span the different clock regimes between these two. In a set of embodiments the Applicant has addressed this by arranging for the divider arrangement to count pulses from the controllable oscillator and to output a signal to the calibration module indicating whether the oscillator is running too fast or too slow. This avoids any need to cross clock domains as it permits a single line interface rather than a data bus. In a set of embodiments the divider arrangement is arranged to determine a state of a counter contained therein when a next transition edge is received from the reference clock and to determine on the basis of said counter state whether the controllable oscillator frequency is too high or too low.

In a set of embodiments the PLL is a fractional N PLL—that is the division factor applied can be varied to give an exact desired frequency. In an exemplary set of such embodiments the divider arrangement comprises a variable modulus prescaler (VMP). The divider arrangement may rely just on the VMP but in a set of embodiments a further divider is also provided. The further divider could be fixed but in a set of embodiments it may be changed to change to a different loop frequency.

In a set of embodiments the PLL is arranged to enter said calibration mode whenever a reset is required. For example it may be arranged to enter said calibration mode whenever a new data packet is transmitted or received, when the transmitter or receiver is arranged to operate on a different frequency channel or when a system changes operation mode from receive to transmit or vice versa.

In a set of embodiments the calibration module is arranged to perform a binary search for a digitally-optimised calibration. This means that a plurality of bits, e.g. of reducing significance, are established. In an exemplary set of embodiments a five bit word is used. This means that there are 32 possible digital tuning calibrations for the PLL so that the voltage control of the frequency need only vary the frequency over 1\32 of the entire range giving a big decrease in the sensitivity of the controllable oscillator (although in practice the bands will typically overlap).

The calibration module preferably comprises a finite state machine.

In a set of embodiments the phase locked loop is used in a frequency synthesizer of a digital radio transmitter or receiver.

An embodiment of the invention will now be described, by way of example only, with reference to the accompanying drawing in which FIG. 1 is a schematic diagram of a phase locked loop embodying the invention.

A fractional N phase locked-loop (PLL) embodying the invention is shown in FIG. 1. As with any PLL this is based on a voltage controlled oscillator (VCO) 102 which is controlled by a phase detector 104 via a low-pass filter 106.

During normal use the phase detector 104 causes small adjustments to the frequency of the VCO 102 in order to bring the phase (and therefore frequency) of the fed-back signal into alignment with the reference clock CK_REF.

A variable modulus pre-scaler (VMP) circuit 108 is used to divide the frequency by P or P+1 depending upon the control signal it receives from a further DIVN divider module 110, which divides the frequency by a further integer N before feeding the phase detector 104. The frequency of the VCO 102 is therefore controlled to be $F_{ref}*N*(nP+m(P+1))$ where $F_{ref}$ is the reference crystal frequency and n and m are the relative proportions of the occurrences of the respective counts P and P+1 over a given time period.

The divider module 110 is controlled by a sigma-delta modulator (SDM) 112 to determine the above-mentioned N and relative proportions of P and P+1 counts, so determining the precise frequency.

The precisely divided average frequency signal is fed to the phase detector 104 which generates an output signal to control the VCO 102 in accordance with any mismatch between the signal from the divider 110 and the reference clock input signal CK_REF.

Also shown in FIG. 1 is a finite state machine (FSM) 114. This takes an input from the DIVN divider module 110 and provides output signals to the controllable oscillator 102, phase detector 104, SDM 112 and DIVN module 110.

In normal use the frequency of the VCO 102 is controlled by changes in a voltage signal from the phase detector 104 via the low pass filter 106. This In turn is controlled by the output from the sigma-delta modulator 112 which exerts influence over the variable modulator pre-scaler 108 and the DIVN module 110. The overall frequency division is thus split between two modules. The pre-scaler 108 has a variable modulus so that it can divide by P or P+1 depending on the control signal from the DIVN 110 which allows for the full range of fractional counts. The pre-scaler 108 could be an asynchronous or ripple counter but this is not essential. The DIVN module 110 is a counter, which may be a synchronous counter that operates on the divided clock and divides by an amount N determined by its control input. The resulting frequency division can therefore be expressed as N*P+A where A represents how many times during one output cycle the VMP 108 has divided by P+1.

The input clock for the VMP 108 is provided by the output of the VCO 102. The VMP 108 produces an intermediate clock which is passed to the DIVN module 110. The output from the DIVN module 110 is a clock signal CK_O1 which is passed to the phase detector 104.

However in accordance with the invention the VCO is not controlled across the entire frequency range which the PLL is able to produce. Instead its frequency can only be varied by means of the voltage applied to it within a relatively narrow frequency band.

In order to determine the band in which the VCO 102 operates a digital tuning is applied during a calibration mode. In this mode, initiated by the FSM the FSM issues control signals which cause the frequency of the VCO 102 no longer to be controlled by the output signal voltage of the phase detector 103 by fixing its output signal voltage. Rather in this mode the controllable oscillator 102 is controlled directly by the FSM 114 which can generate appropriate binary control words to set the frequency of the VCO 102. The control word signals are used to switch capacitors in or out of circuit in the VCO 102 in order to alter its baseline frequency.

In an exemplary embodiment the FSM 114 generates a 5-bit control word to the VCO 102 and undertakes a 5-cycle binary search for the control word which most closely matches the desired frequency, from the most to least significant bit. During each cycle one bit of the tuning word is determined by the DIVN module 110 which monitors the state of its counter as compared to a predetermined expected state when a transition edge is received on the reference clock input CK_REF. If the count is too high the VCO is determined to be running too fast and if it is too low the VCO is determined to be running too low. The DIVN module 110 issues a single bit output to the FSM 114 which uses this to set the control word bit appropriately to set the frequency band of the VCO 102.

Since the count determination is carried out by the divider module 110 itself, rather than the FSM 114, it is not necessary to provide a data bus crossing the respective clock domains, substantially simplifying the circuit.

During calibration the sigma-delta modulator 112 must continue to be operated to ensure that the division factor applied by the divider arrangement 108, 110 (i.e. the values of N and A in the description above) can be altered which gives an adequate frequency resolution. Without this the calibration target would be restricted to multiples of the reference clock frequency. In a typical example the reference clock frequency may be 32 MHz whereas the target accuracy for the calibration process is approximately 5 MHz The SDM 112 is run in a different fractional-N mode during calibration to avoid high levels of quantisation noise and to speed up the calibration process. Specifically the fractional mode is changed from MASH 1-1-1 to MASH 1-1. This removes 'extreme' count values and so means that the divider 110 does not need to run many cycles to reach a reliable conclusion (namely to decide whether the VCO 102 is too fast or too slow. It may, for example, run from −1 to +2, rather than from −3 to +4 in normal mode.

Once the appropriate band has been set for the VCO 102, the system may be returned to normal mode in which the binary control word is fixed, the VCO 102 is controlled by changes in the output of the phase detector 104 and the SDM is reverted to MASH 1-1-1. In this mode the frequency of the VCO 102 is therefore controlled by a voltage but only across a narrow frequency band (e.g. of the order of 70 MHz, rather than the full range of the synthesizer which may be hundreds of MHz). This means that the VCO 102 is only required to have a much lower gain than if it were necessary for the voltage swing to change its frequency across the entire range. This significantly reduces its sensitivity to noise in use.

The calibration may be repeated for example every time a new packet is to be transmitted or received.

The invention claimed is:
1. A phase locked loop comprising:
a controllable oscillator;
a variable divider which takes a signal from the controllable oscillator and divides it by a variable amount to provide a lower frequency signal;
a sigma-delta modulator arranged to provide a control input to said variable divider; and
a phase detector triggered by said lower frequency signal and a reference clock;
wherein said phase locked loop is arranged to be operable in a normal mode in which the controllable oscillator is controlled by a voltage from said phase detector and a calibration mode in which the controllable oscillator is controlled digitally by a signal from a calibration module which receives an input from said variable divider; and wherein the sigma-delta modulator is arranged to overate in a different mode during said calibration mode than during said normal mode.

2. The phase locked loop as claimed in claim 1 wherein the sigma-delta modulator is arranged to operate with second order multi-stage noise shaping in said calibration mode and with third order multi-stage noise shaping in said normal mode.

3. A phase locked loop as claimed in claim 1 wherein the divider arrangement is arranged to count pulses from the controllable oscillator and to output a signal to the calibration module indicating whether the oscillator is running too fast or too slow.

4. The phase locked loop as claimed in claim 3 wherein the divider is arranged to determine a state of a counter contained therein when a next transition edge is received from the reference clock and to determine on the basis of said counter state whether the controllable oscillator frequency is too high or too low.

5. The phase locked loop as claimed in claim 1 which is a fractional N phase locked loop.

6. The phase locked loop as claimed in claim 1 wherein the divider comprises a variable modulus prescaler.

7. The phase locked loop as claimed in claim 6 wherein the divider comprises a further divider.

8. The phase locked loop as claimed in claim 7 wherein the further divider may be changed to change to a different loop frequency.

9. The phase locked loop as claimed in claim 1 arranged to enter said calibration mode whenever a reset is required.

10. The phase locked loop as claimed in claim 1 wherein the calibration module is arranged to perform a binary search for a digitally-optimised calibration.

11. The phase locked loop as claimed in claim 1 wherein the calibration module comprises a finite state machine.

12. A frequency synthesizer comprising a phase locked loop comprising:
a controllable oscillator;
a variable divider which takes a signal from the controllable oscillator and divides it by a variable amount to provide a lower frequency signal;
a sigma-delta modulator arranged to provide a control input to said variable divider; and
a phase detector triggered by said lower frequency signal and a reference clock;
wherein said phase locked loop is arranged to be operable in a normal mode in which the controllable oscillator is controlled by a voltage from said phase detector and a calibration mode in which the controllable oscillator is controlled digitally by a signal from a calibration module which receives an input from said variable divider; and
wherein the sigma-delta modulator is arranged to operate in a different mode during said calibration mode than during said normal mode.

13. A digital radio transmitter or receiver comprising a frequency synthesizer, the frequency synthesizer comprising a phase locked loop comprising:
a controllable oscillator;
a variable divider which takes a signal from the controllable oscillator and divides it by a variable amount to provide a lower frequency signal;
a sigma-delta modulator arranged to provide a control input to said variable divider; and
a phase detector triggered by said lower frequency signal and a reference clock;
wherein said phase locked loop is arranged to be operable in a normal mode in which the controllable oscillator is controlled by a voltage from said phase detector and a calibration mode in which the controllable oscillator is controlled digitally by a signal from a calibration module which receives an input from said variable divider; and
wherein the sigma-delta modulator is arranged to operate in a different mode during said calibration mode than during said normal mode.

* * * * *

UNITED STATES PATENT AND TRADEMARK OFFICE
CERTIFICATE OF CORRECTION

| | | |
|---|---|---|
| PATENT NO. | : 10,230,382 B2 | Page 1 of 1 |
| APPLICATION NO. | : 15/537014 | |
| DATED | : March 12, 2019 | |
| INVENTOR(S) | : Weberg et al. | |

It is certified that error appears in the above-identified patent and that said Letters Patent is hereby corrected as shown below:

In the Claims

<u>Column 5,</u>
Line 1, "overate" should be --operate--.

Signed and Sealed this
Fourteenth Day of February, 2023

*Katherine Kelly Vidal*

Katherine Kelly Vidal
*Director of the United States Patent and Trademark Office*